US005284222A

United States Patent [19]

Ito

[11] Patent Number: 5,284,222

[45] Date of Patent: Feb. 8, 1994

[54] SPEAKER CABINET

[75] Inventor: Masayoshi Ito, Tokyo, Japan

[73] Assignee: Sony Corporation, Tokyo, Japan

[21] Appl. No.: 988,177

[22] Filed: Dec. 9, 1992

[30] Foreign Application Priority Data

Dec. 13, 1991 [JP] Japan .................................. 3-330881
Dec. 13, 1991 [JP] Japan .................................. 3-351892

[51] Int. Cl.[5] .............................................. H05K 5/00

[52] U.S. Cl. .................................... 181/152; 181/153; 181/199

[58] Field of Search ............... 181/144, 147, 148, 152, 181/153, 155, 171, 199

[56] References Cited

U.S. PATENT DOCUMENTS 3,894,612 7/1975 Maeda et al. ........................ 181/199
4,588,042 5/1986 Palet et al. ....................... 181/199 X
4,805,729 2/1989 Wascom .......................... 181/199 X

*Primary Examiner*—Michael L. Gellner
*Assistant Examiner*—Khanh Dang
*Attorney, Agent, or Firm*—Lewis H. Eslinger; Jay H. Maioli

[57] ABSTRACT

A speaker cabinet in which a cross section of an outer peripheral portion (11) is formed as an elliptic shape and opening portions (22 to 25) formed on the outer peripheral portion (11) and into which speakers (2 to 5) are mounted are formed as horn shapes whose diameters are improved toward the outside. The speaker cabinet includes a plywood member (10) that is formed by laminating a hard plate member, a soft plate member and a light and soft rear surface plate member on a face front surface plate member. The cabinet is molded in a predetermined curved fashion to have an elliptic shape. Thus, an acoustic characteristic of the speaker cabinet can be increased and a manufacturing cost of the speaker cabinet can be reduced.

3 Claims, 6 Drawing Sheets

SPEAKER CABINET

BACKGROUND OF THE INVENTION

1. Field of the Invention

The present invention relates to a speaker cabinet which accommodates speakers therein.

2. Description of the Related Art

A conventional speaker cabinet comprises a baffle plate formed in front of a rectangular cabinet, a horn-shaped plate made of a material different from that of the baffle plate and a speaker mounted on the inside of the horn-shaped plate secured to the baffle plate by screws.

Sound waves radiated from a speaker unit are generally affected by a diffraction because of a shape of the speaker cabinet. To remove a disturbance caused by the diffraction of sound waves from a sound pressure frequency characteristic standpoint, it is desirable that the speaker cabinet is formed as a smooth curve shape such as a ball or the like. If, however, the speaker cabinet is formed as the smooth curve shape, then a baffle effect that can push sound pressure in the forward direction is reduced, resulting in an efficiency being lowered. Therefore, from the standpoint such that sensitivity is improved by the baffle effect, it is desirable that the speaker cabinet be formed as a rectangular solid shape. On the basis of the above aspect, a proposed speaker cabinet has a configuration of a curve like a column (see Japanese Laid-Open Patent Publication No. 59-176896).

A conventional speaker cabinet having an elliptic configuration is formed of a wooden plate such as a lauan single plate that can be curved relatively easily upon working.

In the conventional speaker cabinet thus arranged, a crack and a stepped portion are produced between the baffle plate and the horn-shaped plate, resulting in an acoustic characteristics.

Further, the horn-shaped plate is generally formed of an expensive material and therefore the speaker cabinet becomes expensive. In addition, the process for mounting the horn-shaped plate on the front baffle plate becomes complex.

Furthermore, although the lauan single plate utilized to make the elliptic-shaped speaker cabinet is relatively inexpensive, the lauan single plate has poor acoustic characteristics. In addition, the lauan single plate is low in rigidity and therefore tends to be deformed after it has been molded. Also, the lauan single plate cannot be formed as a complex curved surface.

OBJECTS AND SUMMARY OF THE INVENTION

Therefore, it is an object of the present invention to provide an improved speaker cabinet in which the aforesaid shortcomings and disadvantages of the prior art can be eliminated.

It is an object of the present invention to provide a speaker cabinet in which acoustic characteristics can be improved.

It is another object of the present invention to provide a speaker cabinet which can be manufactured with ease.

It is a further object of the present invention to provide a speaker cabinet which can be manufactured inexpensively.

According to an aspect of the present invention, there is provided a speaker cabinet which comprises an outer peripheral portion formed of a laminated plywood, a cabinet formed of a top plate and a bottom plate which respectively close upper and lower end faces of said outer peripheral portion, an opening portion formed on a front surface of said cabinet, and a speaker attached to the inside of said opening portion, wherein a cross section of said outer peripheral portion is formed as an ellipse and said opening portion is formed as a horn-shape whose diameter is increased to the outside.

BRIEF DESCRIPTION OF THE DRAWINGS

A better understanding of other objects, features, and advantages of the present invention will become apparent from the following detailed description of illustrative embodiments thereof, in conjunction with the figures of the accompanying drawings, wherein.

DETAILED DESCRIPTION OF THE PREFERRED EMBODIMENTS

The present invention will hereinafter be described with reference to the drawings.

Figure 1:
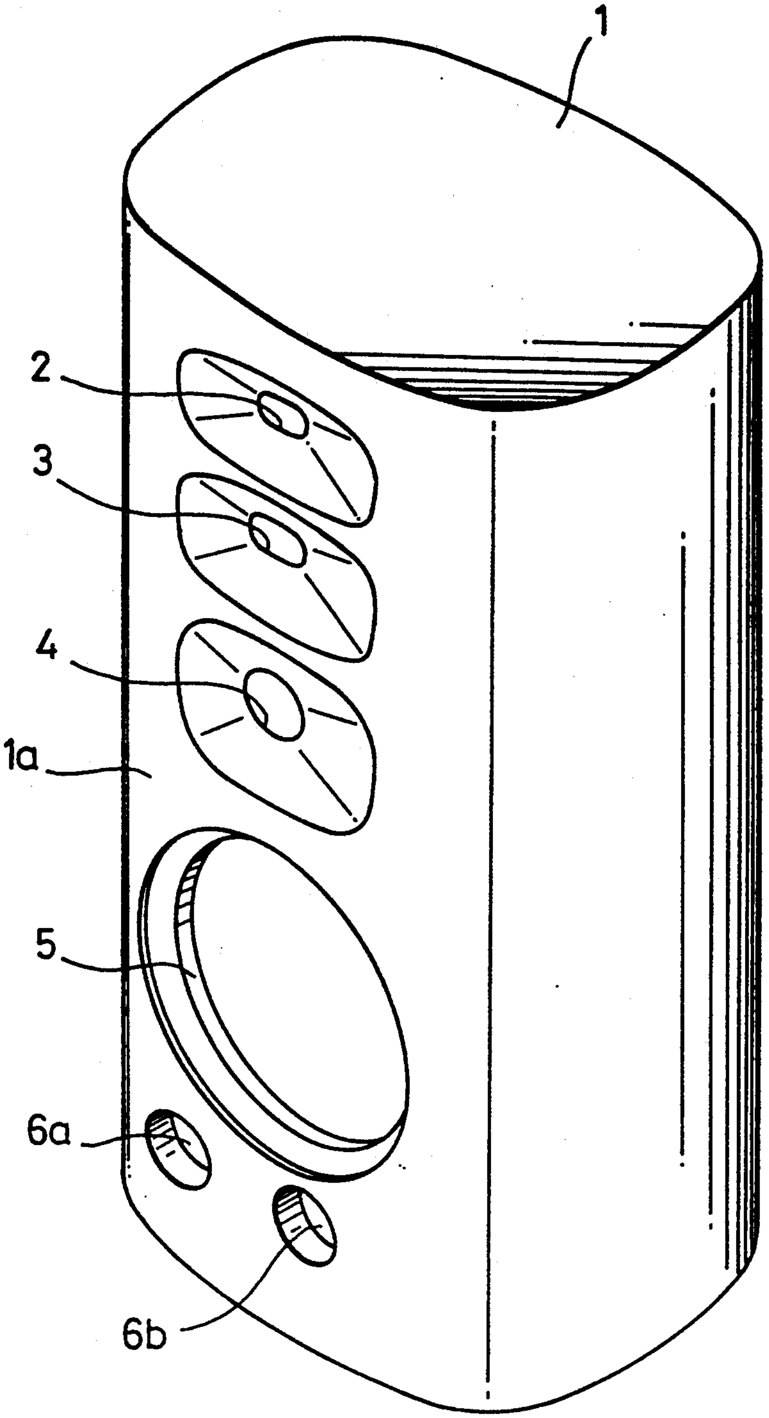
FIG. 1 is a perspective view showing a speaker cabinet according to an embodiment of the present invention.
Figure 2:
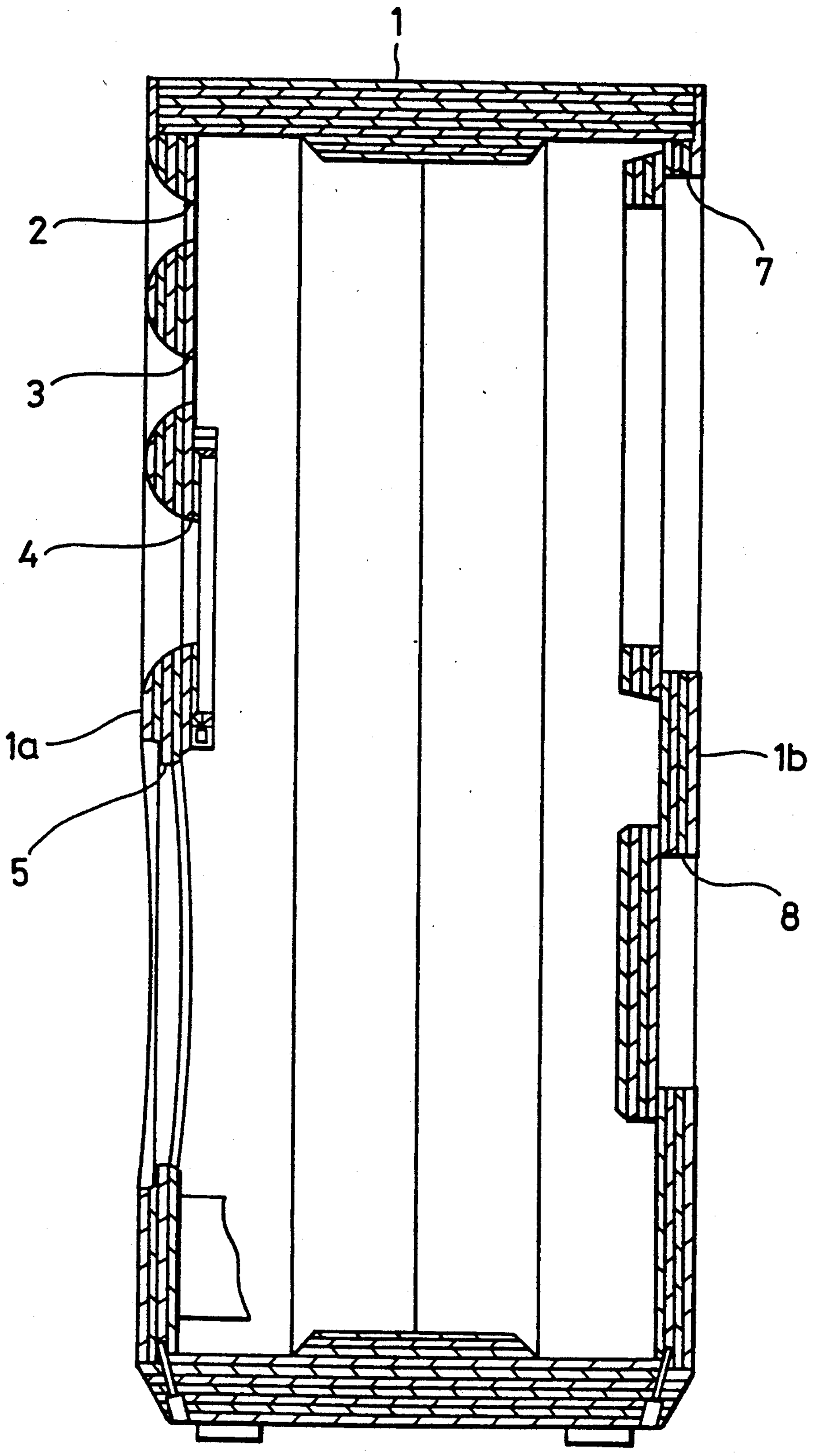
FIG. 2 is a central longitudinal cross-sectional view of the speaker cabinet shown in FIG. 1.

In FIGS. 1 and 2, reference numeral 1 generally designates an overall arrangement of a speaker cabinet according to an embodiment of the present invention. On a front wall 1*a* of the speaker cabinet 1, there are sequentially formed speaker mount opening portions 2, 3, 4 and 5 in the lower direction at predetermined intervals and to which speakers for ultra-high tone, high tone, middle tone and low tone are mounted. Duct opening portions 6*a*, 6*b* are formed on the lower portion of the front wall 1*a* and speaker insertion openings 7 and 8 are formed through the rear wall 1*b*.

Figure 3:
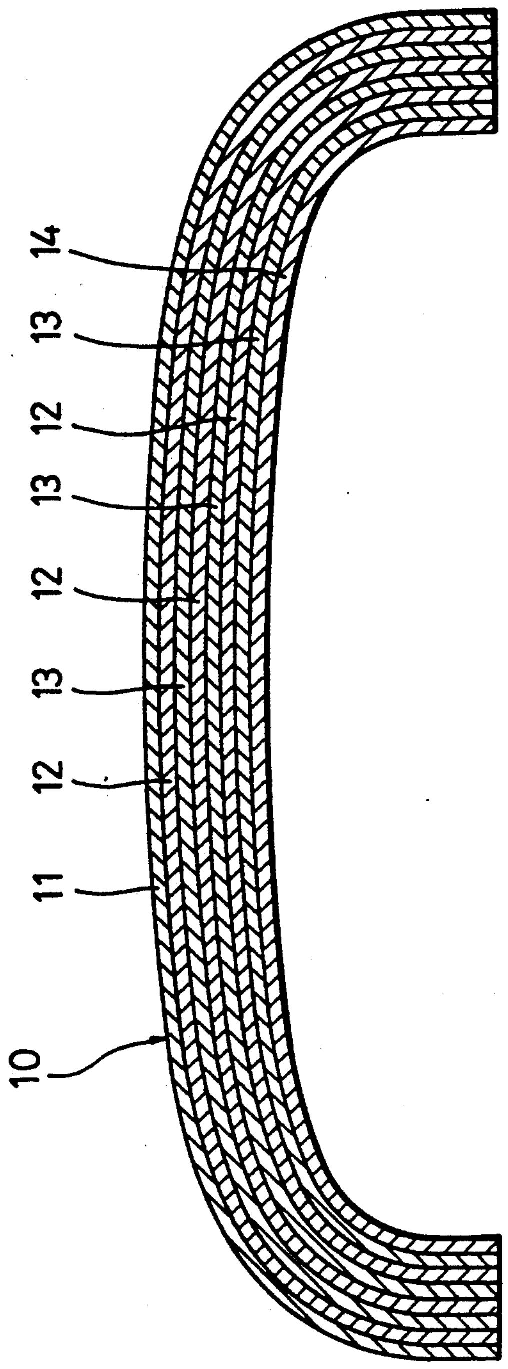
FIG. 3 is a partially cross-sectional view of a plywood member that constructs the speaker cabinet shown in FIG. 1.
Figure 4:
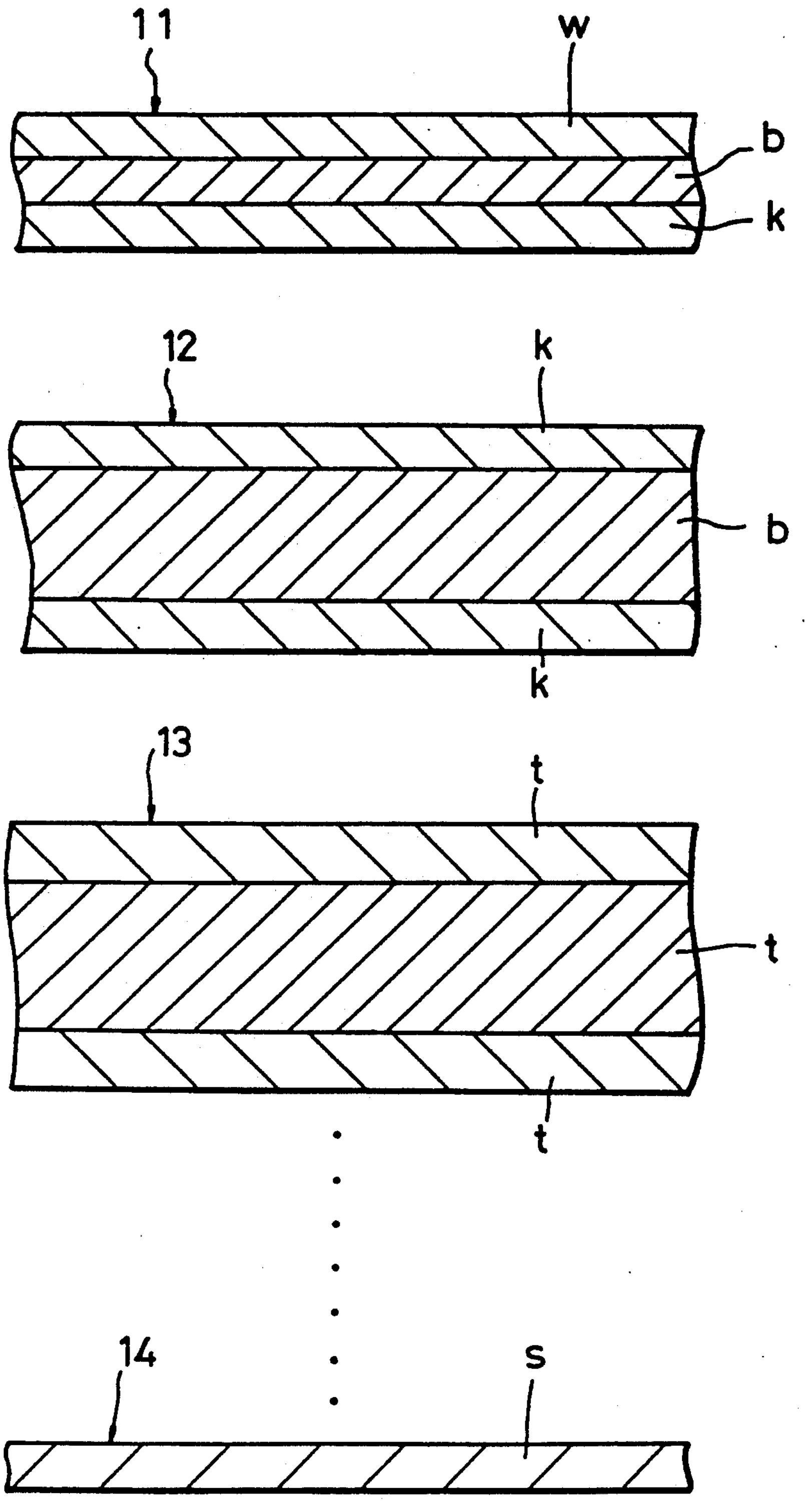
FIG. 4 is a cross-sectional views showing examples of plate members in detail and to which reference will be made in explaining the plywood member shown in FIG. 3.
Figure 5:
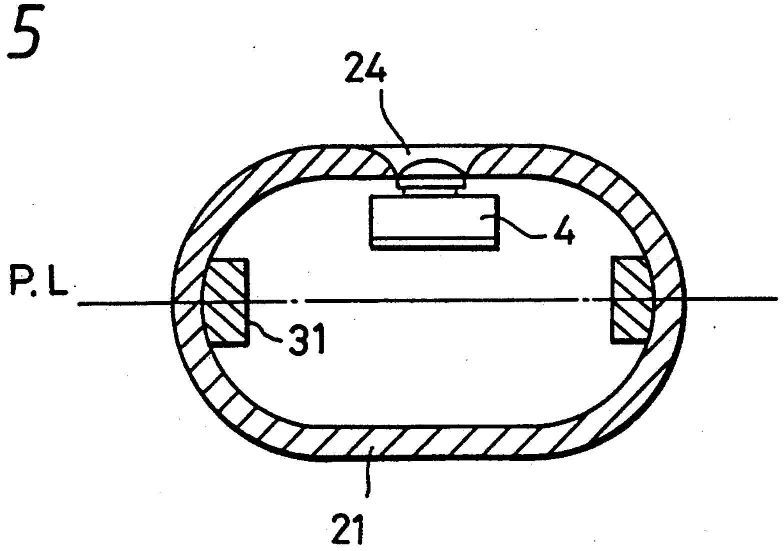
FIG. 5 is a cross-sectional view showing the speaker cabinet according to the present invention.

The speaker cabinet 1 is formed of a plywood member 10 shown in FIGS. 3 and 4.

As shown in FIGS. 3 and 4, this plywood member 10 is formed by laminating a face front surface plate member 11, a hard plate member 12, a soft plate member 13 and a light and soft rear surface plate member 14. Although these plate members 11 to 14 are formed of single plate, they are formed of plywood members in this embodiment.

By way of example, the face front plate member 11 is formed by laminating a walnut front surface single plate w serving as a front surface plate, a beech single plate b serving as a core plate and a birch single plate k serving as a rear surface plate in such a manner that fiber directions thereof are made perpendicular to each other. In this case, a thickness of each of the single plates w, b, k is selected to be 0.5 mm.

The hard plate member 12 is formed by laminating thin (0.5 mm) birch single plates k on both sides of the thick (1.5 mm) beech single plate b in such a manner that fiber directions thereof are made perpendicular to each other.

Further, the soft plate member 13 is formed by laminating three Japanese linden single plates t. A thickness of a core plate of the soft plate member 13 is selected to be 1.7 mm and a thickness of both side plates is selected to be 0.65 mm. The core plate and both side plates are laminated such that fiber directions thereof are made perpendicular to each other.

The light and soft rear surface plate member 14 is formed of a spruce single plate s and a thickness of this light and soft rear surface plate member 14 is selected to be 0.5 mm.

The plywood member 10 is formed by laminating the plate members 11 to 14 thus constructed. Since the 25.5 mm-thick plywood member 10 is utilized as the material that constructs the speaker cabinet 1 of this embodiment, many (eight) hard plate members 12 and soft plate members 13 are alternately laminated on the face front surface plate member 11 and the light and soft rear surface plate member 14 is finally laminated, whereafter they are bonded by an adhesive.

The plywood member 10 thus constructed is compressed within a wooden pattern having a semi-elliptic configuration and an adhesive is reacted and cured by a high-frequency heating treatment so that the cross section of the speaker cabinet 1 has a predetermined elliptic curve. Two semi-elliptic outer peripheral portions thus constructed are bonded by a bonding material. The bottom plate and the top plate are respectively bonded to lower and upper end faces of the elliptic outer peripheral portion. The beech single plate b utilized as the core plate of the cabinet molding plywood member 10 has a large specific gravity and a rigidity. Therefore, the beech single plate b contributes to the stability of dimension after the molding. The birch single plate k is uniform in quality and has a small fluctuation of specific gravity. Therefore, the birch single plate k is effective for preventing the speaker cabinet 1 from becoming twisted and warped. Thus, the speaker cabinet 1 can be prevented from being deformed substantially perfectly.

Since the Japanese linden single plate t utilized as the soft plate member 13 has excellent acoustic characteristics and relatively inexpensive, it is effective for holding the overall thickness of the cabinet molding plywood member 10. Further, since the spruce single plate s utilized as the rear surface plate 14 has excellent acoustic characteristics the entirety of the speaker cabinet 1 can be given satisfactory acoustic characteristics. Consequently, the acoustic characteristics of the speaker cabinet 1 can be improved considerably.

Furthermore, since the respective single plates of the plate members 11 to 14 constructing the plywood member 10 are laminated and bonded such that fiber directions thereof are made perpendicular to each other, an overall strength (rigidity) of the speaker cabinet 1 can be made uniform. Therefore, the speaker cabinet 1 can be prevented from becoming twisted and distorted.

According to the above arrangement of this embodiment, it is possible to obtain the speaker cabinet 1 having an excellent acoustic characteristic and which can be substantially protected from an aging change.

As the front surface plate of the face front surface plate member 11, the walnut single plate may be replaced with a teak single plate. Also, as the single plates of other plate members 12 to 14, it is possible to use other materials so long as they have characteristics substantially the same as those of the aforesaid single plates.

Figure 6:
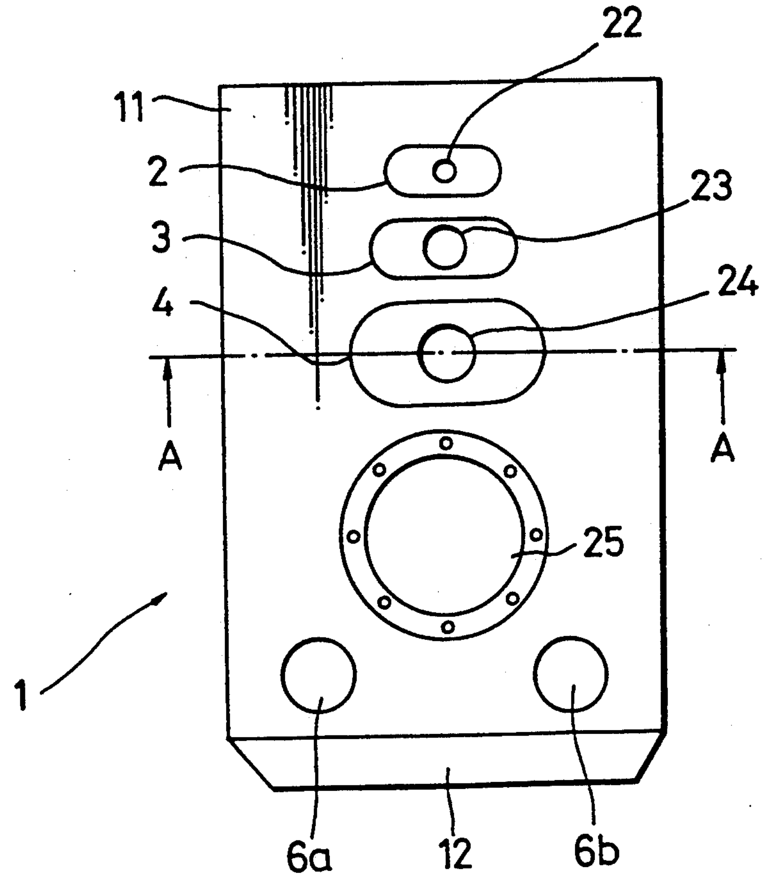
FIG. 6 is a front view of the speaker cabinet according to the present invention.
Figure 7:
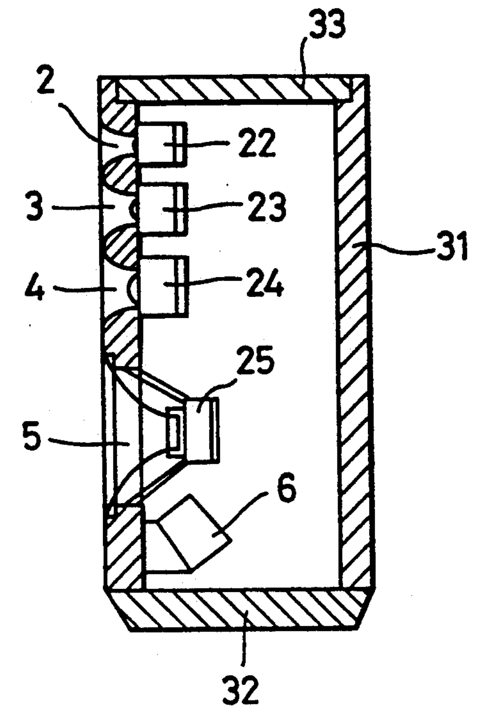
FIG. 7 is a longitudinal cross-sectional view showing the speaker cabinet according to the present invention.
Figure 8:
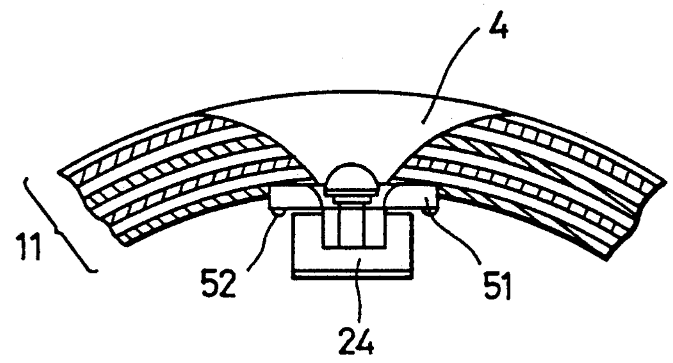
FIG. 8 is a diagram showing a main portion of the speaker cabinet in an enlarged scale.

The elliptic opening portions 2, 3 and 4 are formed on the front wall of the outer peripheral portion 21 of the speaker cabinet 1 along its central line in the width direction. The circular opening portion 5 is formed under the opening portion 4. On the insides of the respectively opening portions 2, 3, 4 and 5, there are attached the ultra-high tone speaker 22, the high-tone speaker 23, the middle-tone speaker 24 and the low-tone speaker 25, respectively. A pair of left and right ducts *6a*, *6b* are formed on the inside lower portion of the speaker cabinet 1. The respective opening portions 2 through 4 are formed as horn-shapes whose diameters are increased toward the outside. As shown in FIG. 8 which is a cross-sectional view taken along the line A—A in FIG. 6, a speaker 24, for example, is secured to the inner surface of the outer peripheral portion 21 through a flange portion 52 by means of screws 52. The opening portions 2 to 5 are formed with high precision by a machining of metals by using an NC (numerical control) router to which calculated values of horn-shapes are input in advance. These horn-shapes are selected such that the areas of opening portions are exponentially increased from the rear surface to the front surface of the speaker cabinet 1.

According to this embodiment, since the horn-shaped opening portions 2 through 5 are formed on the front wall of the elliptic outer peripheral portion 11 of the speaker cabinet 1, the speaker cabinet 1 and the horn portions which are separately formed are formed as one body. Therefore, the spacing and the stepped portion can be removed so that the acoustic characteristic of the speaker cabinet 1 can be improved. In addition, since the horn portions that were formed independently of the speaker cabinet are not needed, the number of assembly parts of the speaker cabinet can be reduced and the manufacturing cost can be reduced.

Figure 9:
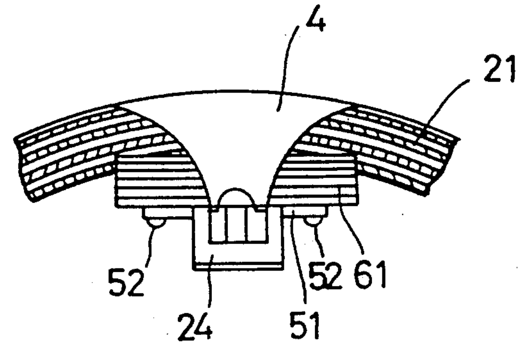
FIG. 9 is a transversal cross-sectional view showing a structure of a main portion of the speaker cabinet according to another embodiment of the present invention.

FIG. 9 shows an arrangement of a main portion of the speaker cabinet according to another embodiment of the present invention. In FIG. 9, like parts corresponding to those of preceding figures of drawings are marked with the same references and therefore need not be described in detail. According to this embodiment, another laminated plywood member 61 is sandwiched between an inner peripheral portion of the outer peripheral portion 11 and a flange portion 51 of the speaker 24. Then, the laminated plywood member 61 is integrally attached to the outer peripheral portion 21 by the screws 52. The horn-shaped opening portion 4 is formed coaxially with the speaker 24 through the outer peripheral portion 21 and the laminated plywood member 61.

According to the second embodiment of the present invention, the depth of the horn-shaped portion is increased and therefore an acoustic characteristic of the speaker cabinet can be improved more.

While the number of the speakers and the opening portions are mentioned above by way of example, the present invention is not limited thereto and the number of the speakers and the opening portions can be varied freely.

As set out above, according to the speaker cabinet of the present invention, since the cross section of the outer peripheral portion of the speaker cabinet is formed as the elliptic shape and the speaker opening portions formed on the outer peripheral portion of the speaker cabinet are formed as the horn shapes whose diameters are increased toward the outside, the speaker cabinet and the horn-shaped portions can be formed as one body with each other and the bonded portion can be removed. As a result, the spacing and the stepped portion are removed so that acoustics can be improved. In addition, the number of assembly parts of the speaker cabinet can be reduced and the speaker cabinet can be manufactured inexpensively.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A speaker cabinet comprising:

an outer peripheral wall portion arranged substantially vertically and being formed of a laminated plywood member, said wall portion having open upper and lower end faces;

a top plate and a bottom plate for respectively closing said upper and lower end faces of said outer peripheral wall portion to form a closed cabinet;

an opening portion formed on a front surface of said cabinet; and a speaker attached to an inside surface of said wall portion at said opening portion, wherein a cross-section of said outer peripheral wall portion at said opening portion is formed as an ellipse and said opening portion is formed as a horn-shape whose diameter is increased toward an outside surface of said wall portion.

2. The speaker cabinet according to claim 1, wherein said plywood member is formed as a laminated hard plate member, a soft plate member, a soft rear surface plate member, and a face front surface plate member and is shaped as a predetermined curved plywood member, wherein at least a cross-section of said plywood member is formed to have partly an elliptic curve.

3. The speaker cabinet according to claim 1, wherein a second laminated plywood member is held between said inside surface of said outer peripheral wall portion and a flange portion of a speaker and said opening portion is formed coaxially with said speaker so that said opening portion communicates with said outer peripheral wall portion and said second laminated plywood member.

* * * * *

UNITED STATES PATENT AND TRADEMARK OFFICE

CERTIFICATE OF CORRECTION

PATENT NO. : 5,284,222

DATED : February 8, 1994

INVENTOR(S) : Masayoshi Ito

It is certified that error appears in the above-indentified patent and that said Letters Patent is hereby corrected as shown below:

In the Abstract, line 6, change "improved" to --increased--
line 12, change "an acoustic characteristic" to --acoustic characteristics--
line 13, change "increased" to --improved--
Col. 1, line 37, change "an" to --a deterioration of--
Col. 3, line 53, after "and" insert --is--
line 57, after "characteristics" insert --,--

Signed and Sealed this

Twenty-fourth Day of January, 1995

Attest:

Bruce Lehman

BRUCE LEHMAN

*Attesting Officer*

*Commissioner of Patents and Trademarks*